United States Patent
Ko et al.

(10) Patent No.: US 7,262,141 B2
(45) Date of Patent: Aug. 28, 2007

(54) METHODS FOR CLEANING A SEMICONDUCTOR SUBSTRATE HAVING A RECESS CHANNEL REGION

(75) Inventors: Hyung-Ho Ko, Seoul (KR); Chang-Ki Hong, Gyeonggi-do (KR); Sang-Jun Choi, Seoul (KR); Dong-Gyun Han, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/194,794

(22) Filed: Aug. 1, 2005

(65) Prior Publication Data

US 2006/0030117 A1    Feb. 9, 2006

(30) Foreign Application Priority Data

Aug. 3, 2004  (KR) .................. 10-2004-0061228

(51) Int. Cl.
*H01L 21/302* (2006.01)
*H01L 21/461* (2006.01)

(52) U.S. Cl. ............... 438/745; 438/906; 438/296; 257/E21.224

(58) Field of Classification Search ............. 438/270, 438/296, 424, 589, 906, 745; 257/E21.224, 257/E21.228, E21.229; 134/1.3
See application file for complete search history.

(56) References Cited

U.S. PATENT DOCUMENTS

| | | | | |
|---|---|---|---|---|
| 5,656,097 A | * | 8/1997 | Olesen et al. | 134/1 |
| 6,040,232 A | * | 3/2000 | Gau | 438/424 |
| 6,066,609 A | * | 5/2000 | Martin et al. | 510/175 |
| 6,703,271 B2 | * | 3/2004 | Yeo et al. | 438/221 |
| 6,991,985 B2 | * | 1/2006 | Dong et al. | 438/261 |

FOREIGN PATENT DOCUMENTS

| | | |
|---|---|---|
| JP | 06-112179 | 4/1994 |
| JP | 07-240394 | 9/1995 |
| JP | 2002-313768 | 10/2002 |

\* cited by examiner

*Primary Examiner*—George Fourson
*Assistant Examiner*—John M. Parker
(74) *Attorney, Agent, or Firm*—Myers Bigel Sibley & Sajovec, PA (57) ABSTRACT

A method for cleaning a semiconductor substrate forming device isolation layers in a predetermined region of a semiconductor substrate to define active regions; etching predetermined areas of the active regions to form a recess channel region and such that sidewalls of the device isolation layers are exposed; and selectively etching a surface of the recess channel region using a predetermined cleaning solution to clean the semiconductor substrate where the recess channel region has been formed.

19 Claims, 5 Drawing Sheets

| Dilution Rate | Increase/Decrease of Particles | Polysilicon Etch Rate (Å/min) |
|---|---|---|
| 1:1:1000 | +44270 | ~200 |
| 1:3:1000 | +283 | ~100 |
| 1:5:1000 | -20 | ~35 |

Fig. 6

| (70°C, 10min) | Polysilicon | | | High Temperature USG |
|---|---|---|---|---|
| $NH_4OH:H_2O_2:H_2O$ | Etch Amount (Å) | Range (Å) | Etch Uniformity (%) | Etch Amount (Å) |
| 1:5:1000@70°C, 10min | 33 | 0.8 | 1.2 | 8 |
| 1:4:20@70°C, 10min | 34 | 3.2 | 5.2 | 28 |

METHODS FOR CLEANING A SEMICONDUCTOR SUBSTRATE HAVING A RECESS CHANNEL REGION

CROSS-REFERENCE TO RELATED APPLICATIONS

This application claims the benefit of priority from Korean Patent Application No. 2004-61228, filed on Aug. 3, 2004, in the Korean Intellectual Property Office, the disclosure of which is incorporated herein in its entirety by reference.

FIELD OF THE INVENTION

The present invention relates to methods for fabricating semiconductor devices and, more particularly, to a method for cleaning a semiconductor substrate having a recess channel region.

BACKGROUND OF THE INVENTION

A problem to be solved for the high integration of semiconductor devices is a short-channel effect caused with reduction in gate linewidth in a transistor. Recently, Samsung Electronics Co., Ltd. suggested a recess channel array transistor (R-CAT) to overcome this problem.

A method of fabricating a DRAM device using an R-CAT process will now be described with reference to FIG. 1, which shows a portion of a cell array region of the DRAM device. FIG. 2A and FIG. 2B are cross-sectional views taken along lines I-I' and II-II' of FIG. 1, respectively.

Figure 1:
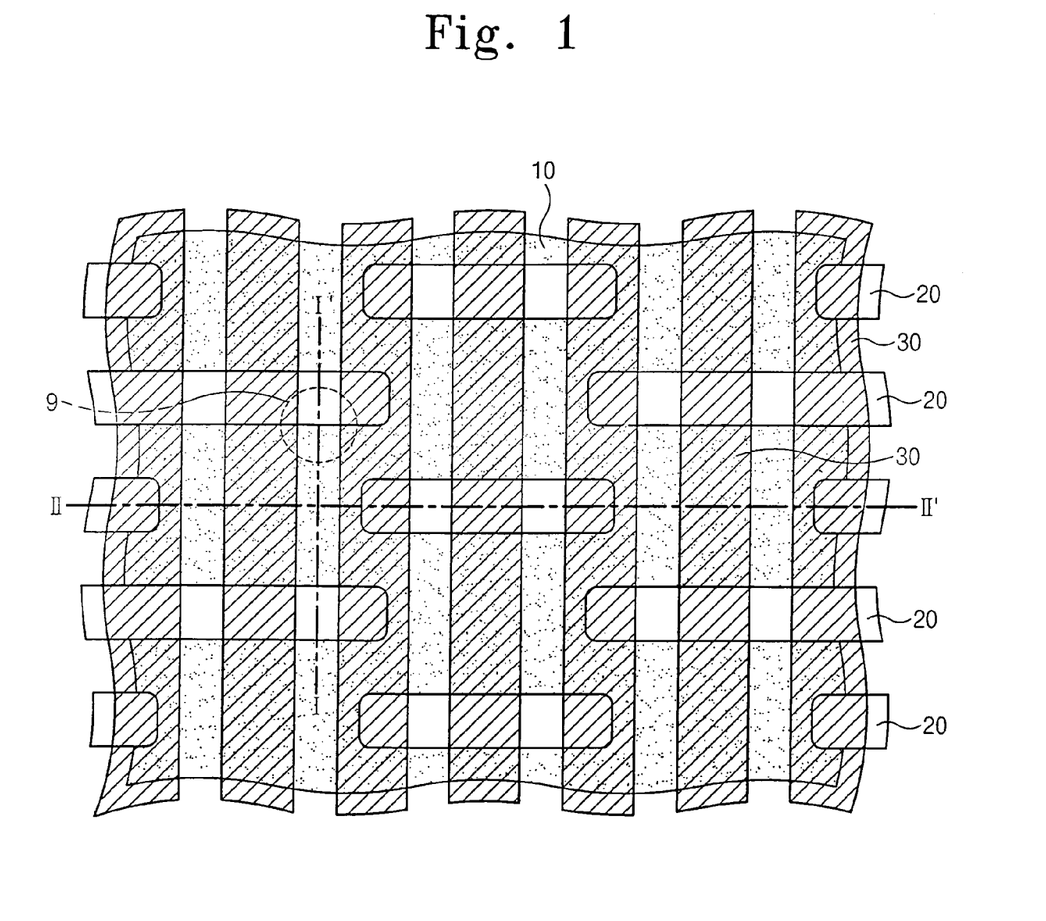
FIG. 1 is a top plan view for explaining several steps of a procedure for fabricating a DRAM device having a recess channel region.
Figure 2A:
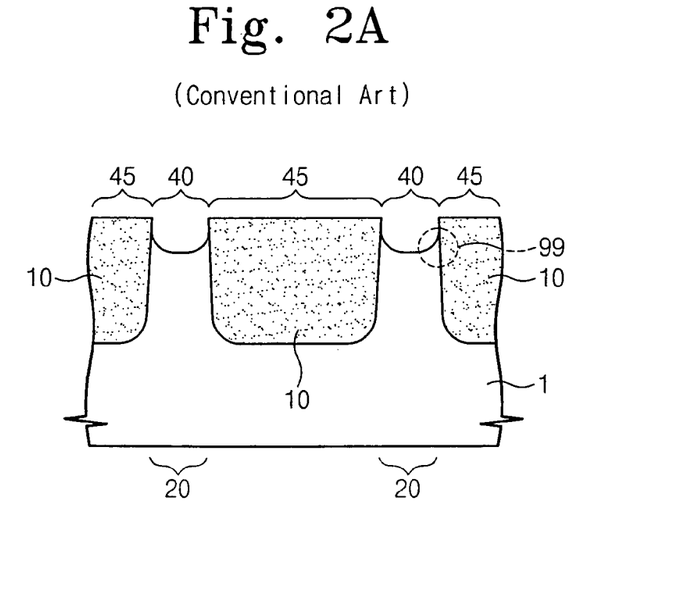
FIG. 2A and FIG. 2B are cross-sectional views for explaining a conventional method for cleaning a semiconductor device having a recess channel region.
Figure 2B:
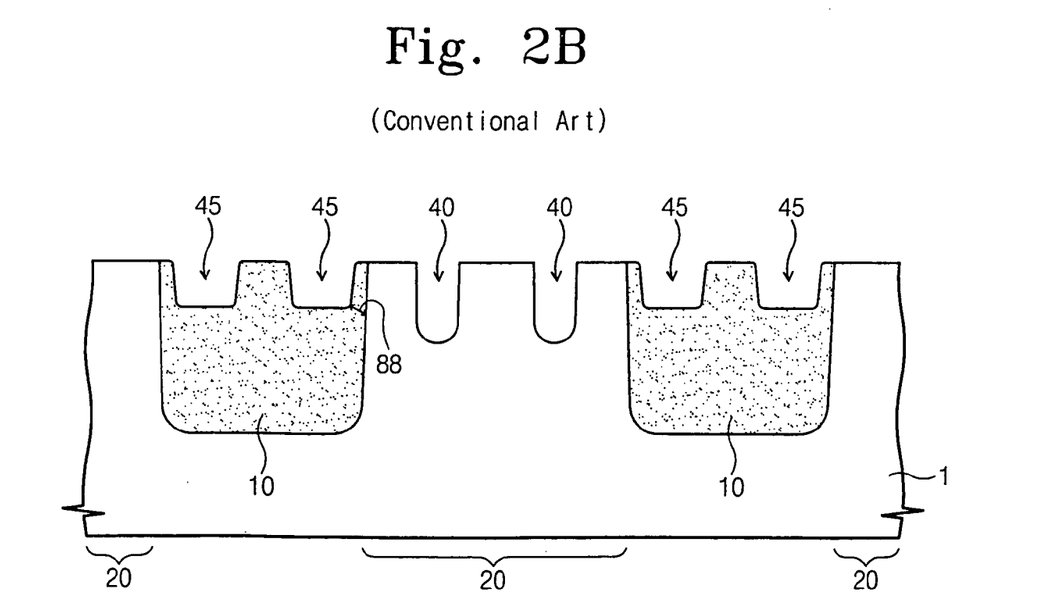

Referring to FIG. 1, FIG. 2A, and FIG. 2B, device isolation layers 10 are formed in a predetermined region of a semiconductor substrate 1 to define active regions 20. Conventionally, formation of each device isolation layer 10 is done using a shallow trench isolation (STI) technique. Mask patterns 30 are formed on a resultant structure where the device isolation layer 10 is formed. The mask patterns 30 expose top surfaces of the active regions 20 and the device isolation layer 10. In a process for fabricating a DRAM device, three mask patterns 30 are formed on the respective active regions 20 to expose the top surface of each active region 20 at two spots (between three mask patterns), as illustrated in FIG. 1.

With reference to FIG. 2A, using the mask patterns as etch masks, the exposed active regions 20 are anisotropically dry-etched to form a recess channel region 40. In the case of the foregoing DRAM device, two recess channel regions 40 are formed in the respective active regions 20. Formation of the recess channel region 40 is followed by a typical gate forming process (not shown) including sequentially forming a gate insulation layer and a gate conductive layer.

In a top surface of the semiconductor substrate 1, the center of the recess region 40 is less etched than a boundary portion 9 (FIG. 1) contacting the device isolation layer 10 during the etch for forming the recess channel region 40. Thus, a bottom surface of the recess channel region 40 is gradually elevated to contact a sidewall of the device isolation layer 10. As a result, an upwardly sharp active-region protrusion 99 (FIG. 2A) is formed at the boundary portion 9 (FIG. 1) of the device isolation layer 10 and the recess channel region 40.

Due to a protruding shape of the active-region protrusion 99, an electric field may concentrate at the active-region protrusion 99 when a voltage is applied to the active region. Since the concentration of the electric field may result in leakage current caused by a tunneling phenomenon, the active-region protrusion 99 must be removed prior to formation of the gate insulation layer. The removal of the active-region protrusion 99 is conventionally done using chemical dry etching (CDE). However, the CDE must be performed for each wafer individually, which may result in poor processing efficiency.

As illustrated in FIG. 1 and FIG. 2B, the mask patterns 30 also expose a top surface of the device isolation layer 10. Thus, during the etch for forming the recess channel region 40, the top surface of the device isolation layer 10 is etched to form a recess or gap area 45 (FIG. 2B). However, the gap area 45 may have a portion 88 that extends to the vicinity of an active region during the removal of the active-region protrusion 99. If the gap region 45 extends to the vicinity of the active region, an electric short may occur between the active region 20 and the gate conductive layer. For this reason, there is a requirement to remove the active-region protrusion 99 while reducing the depth of a recess (i.e., the gap region 45) of the device isolation layer 10.

SUMMARY OF THE INVENTION

Embodiments of the present invention are generally directed to cleaning methods for selectively removing silicon while offering a high production efficiency. The cleaning methods may be employed to effectively remove an active-region protrusion while reducing or minimizing the formation of a recess in a device isolation layer.

According to embodiments of the present invention, a method for cleaning a semiconductor substrate includes: forming device isolation layers in a predetermined region of a semiconductor substrate to define active regions; etching predetermined areas of the active regions to form a recess channel region and such that sidewalls of the device isolation layers are exposed; and selectively etching a surface of the recess channel region using a predetermined cleaning solution to clean the semiconductor substrate where the recess channel region has been formed.

The step of selectively etching the surface of the recess channel region may include selectively etching the device isolation layer at an etch rate that is at least 10 times lower than an etch rate of the recess channel region.

According to some embodiments, the cleaning solution is a mixture including from 0.1 to 1 volume percent ammonia solution, from 0.3 to 1 volume percent hydrogen peroxide solution, and from 98 to 99.6 volume percent deionized water. According to some embodiments, the concentration of the hydrogen peroxide solution in the cleaning solution is at least 5 volume percent.

In some embodiments, the step of selectively etching the surface of the recess channel region is performed at a temperature in the range of from about 40 to 80 degrees centigrade. The step of selectively etching the surface of the recess channel region may be performed using at least one process selected from the group consisting of a spin spray process, a centrifugal spray process, a spin process using DI-Sonic, a dip process, and a dip process using megasonic power. In some embodiments, the device isolation layer includes at least one material selected from the group consisting of high density plasma oxide, high temperature USG, low-k dielectric, SOG, and SiGe. The step of selectively etching the surface of the recess channel region may be performed in a predetermined bath into which the cleaning solution is supplied at a predetermined flow rate.

According to some embodiments, the step of forming the device isolation layers comprises: forming trench mask patterns on the active regions; using the trench mask patterns as etch masks, anisotropically etching the semiconductor substrate to define the active regions; forming the device isolation layers to fill the trenches; planarizing the device isolation layers until the trench mask patterns are exposed; and removing the trench mask patterns. The cleaning method may further include, before forming the device isolation layers: forming a thermal oxide layer on an inner wall of the trench; and conformally forming a liner layer on an entire surface of the thermal oxide layer.

According to some embodiments, the step of etching predetermined areas of the active regions includes: forming mask patterns on the resultant structure where the device isolation layers are formed to expose top surfaces of the active regions and the device isolation layers; isotropically etching the exposed active regions using the mask patterns as etch masks; and removing the mask patterns.

The cleaning method may further include, before the step of selectively etching the surface of the recess channel region, forming a pad insulation layer on the resultant structure where the device isolation layers are formed. In some embodiments, the pad insulation layer includes a material having an etch selectivity with respect to the semiconductor substrate such that the etch rate of the cleaning solution for the semiconductor substrate is greater than the etch rate of the cleaning solution for the pad insulation layer. The pad insulation layer may include a silicon oxide-containing, medium temperature oxide.

Further features, advantages and details of the present invention will be appreciated by those of ordinary skill in the art from a reading of the figures and the detailed description of the preferred embodiments that follow, such description being merely illustrative of the present invention.

DETAILED DESCRIPTION OF EMBODIMENTS OF THE INVENTION

The present invention now will be described more fully hereinafter with reference to the accompanying drawings, in which illustrative embodiments of the invention are shown. In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that when an element is referred to as being "coupled" or "connected" to another element, it can be directly coupled or connected to the other element or intervening elements may also be present. In contrast, when an element is referred to as being "directly coupled" or "directly connected" to another element, there are no intervening elements present. Like numbers refer to like elements throughout. As used herein the term "and/or" includes any and all combinations of one or more of the associated listed items.

In addition, spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

Well-known functions or constructions may not be described in detail for brevity and/or clarity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3A:
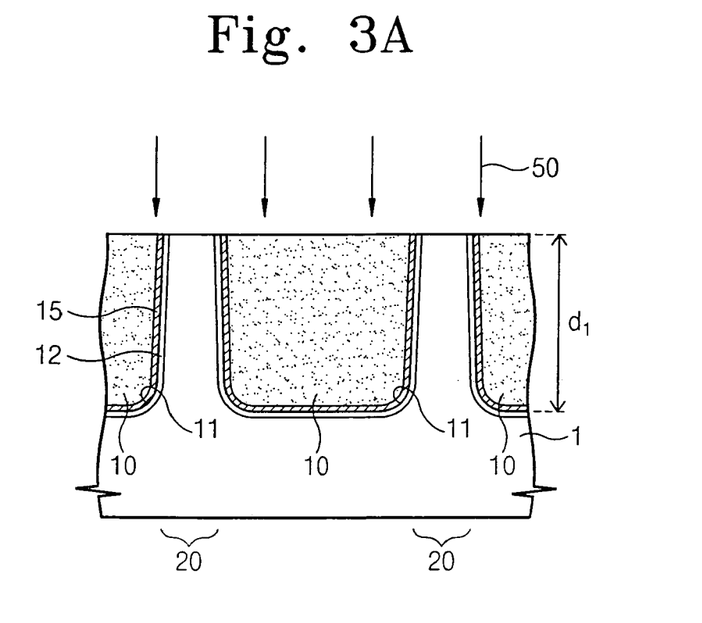
FIG. 3A, FIG. 3B, FIG. 4A, and FIG. 4B are cross-sectional views for explaining a method for cleaning a semiconductor device having a recess channel region according to embodiments of the present invention. The cross-sectional views of FIG. 3A and FIG. 4A are taken along the line I-I' of FIG. 1. The cross-sectional views of FIGS. 3B and 4B are taken along line II-II' of FIG. 1.
Figure 3B:
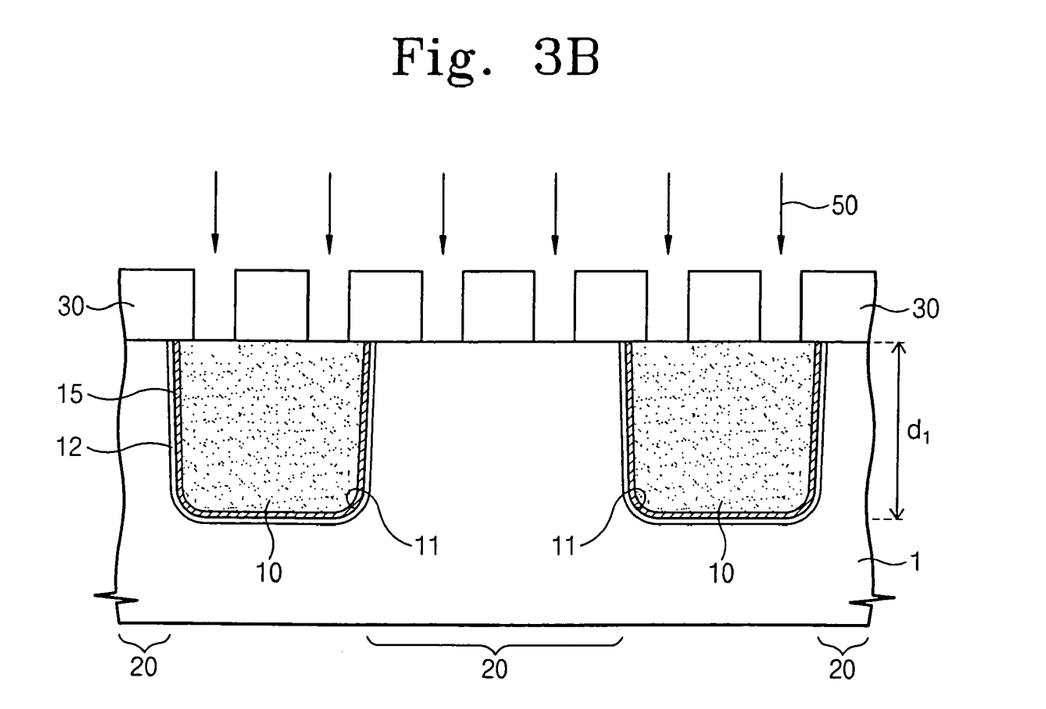
Figure 4A:
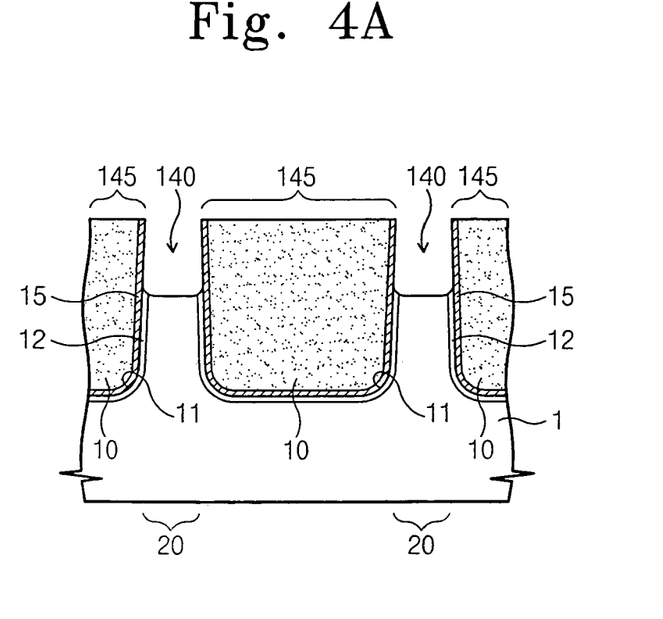
Figure 4B:
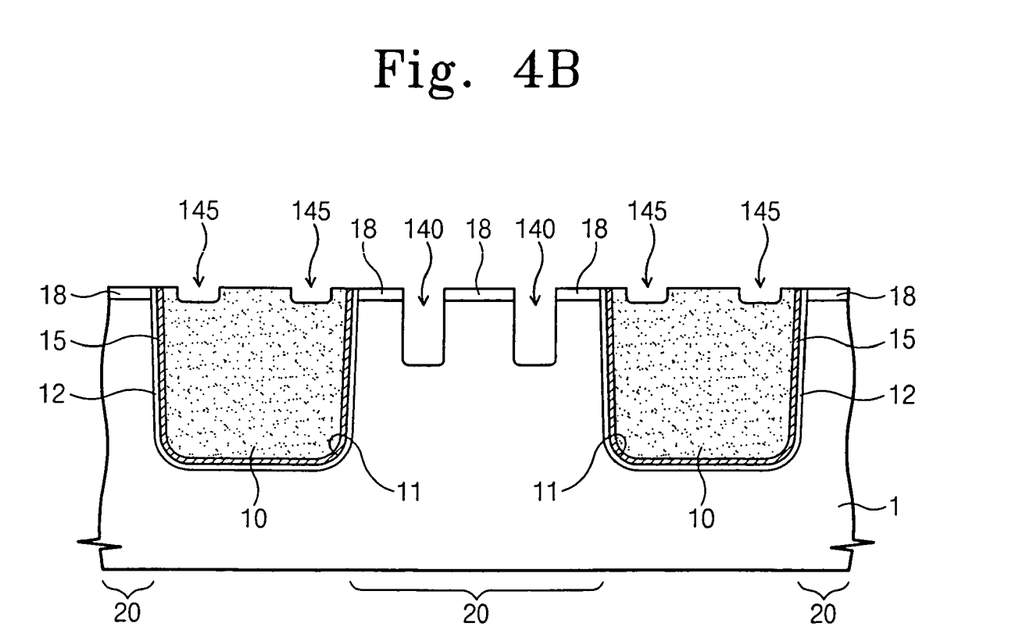

FIG. 3A and FIG. 4A are cross-sectional views taken along the line I-I' of FIG. 1, and FIG. 3B and FIG. 4B are cross-sectional views taken along the line II-II' of FIG. 1.

Referring to FIG. 3A and FIG. 3B, device isolation layers 10 are disposed in a predetermined region of a semiconductor substrate 1 to define active regions 20. The device isolation layers 10 are formed using a shallow trench isolation (STI) technique.

According to the STI technique, trench mask patterns are formed in a predetermined region of the semiconductor substrate 1. Using the trench mask patterns as etch masks, the semiconductor substrate 1 is anisotropically etched to form trenches 11 (FIGS. 3A and 3B) between the trench mask patterns. The trenches 11 define the active regions 20. A predetermined insulation layer is formed to fill each trench 11. The insulation layer is planarized until a top surface of the trench mask pattern is exposed to form a device isolation layer 10 filling the trench 11 and defining an active region.

The trench mask pattern is removed to expose the active regions 20. According to the present invention, the insulation layer (and, thus, the device isolation layer 10) may be made of at least one material selected from the group consisting of high density plasma oxide (HDP oxide), high temperature USG, low-k dielectric, SOG, and SiGe.

In modified embodiments of the present invention, prior to formation of the insulation layer, a thermal oxidation process may be further performed to form a silicon oxide layer 12 on an inner wall of the trench 11. Additionally, prior to formation of the insulation layer, a liner layer 15 may be further formed to conformally cover an entire surface or side of the resultant structure of the thermal oxide layer 12. According to some embodiments, the liner layer 15 is formed of silicon nitride.

Mask patterns 30 (FIG. 3B) are formed on an entire surface or side of the resultant structure where the device isolation layers 10 are formed. The mask patterns 30 expose top surfaces of the active regions 20 and the device isolation layers 10. According to some embodiments, the mask patterns 30 are photoresist patterns formed using a photolithographic process. In the case of a process for fabricating a DRAM device, three mask patterns 30 are formed on the respective active regions 20. The mask patterns 30 are disposed across the active regions 20 and the device isolation layers 10. Using the mask pattern 30 as an etch mask, the exposed top surfaces of the active regions 20 are anisotropically etched (as indicated by the numeral 50 in FIG. 3B).

Referring to FIG. 4A and FIG. 4B, uncovered active regions 20 are etched during the anisotropic etch 50 to form recess channel regions 140. In the case of the above-described DRAM device, two recess channel regions 140 are formed in each active region 20 (see FIG. 4B). During formation of the recess channel regions 140, the top surface of each device isolation layer 10 is etched to form predetermined recesses or gap regions 145.

The etch for forming the recess channel regions 140 is performed using an etch recipe having an etch selectivity as between the device isolation layers 10 and the active regions 20. More particularly, the etch recipe has a greater etch rate for the active regions 20 than for the device isolation layers 10. As a result, the active regions 20 are etched at a greater etch rate than the etch rate of the device isolation layers 10 so that the channel regions 140 are deeper than the gap regions 145, as shown in FIG. 4B.

In embodiments of the present invention, following formation of the recess channel regions 140, a predetermined diluted cleaning solution is used to clean the semiconductor substrate 1 where the recess channel regions 140 are formed. The recess channel regions 140 may be selectively etched using the diluted cleaning solution. The diluted cleaning solution has an etch selectivity as between the active regions 20 and the device isolation layers 10. More particularly, the diluted cleaning solution has an etch rate for the active regions 20 that is greater than its etch rate for the device isolation layers 10. According to some embodiments, the etch rate of the diluted cleaning solution on the device isolation layers 10 is at least ten (10) times less than the etch rate of the diluted cleaning solution on the active regions 20 about the recess channel regions 140.

Figure 5:
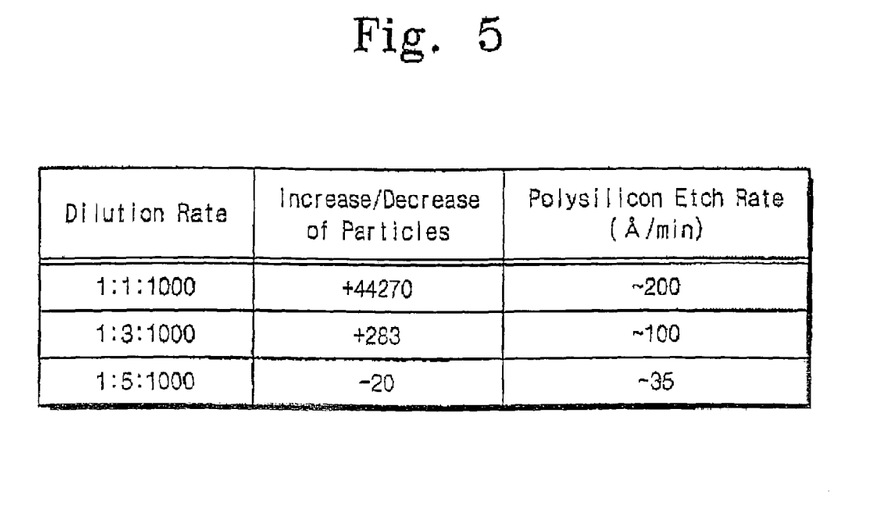
FIG. 5 is a table for explaining an influence of a dilution ratio of hydrogen peroxide solution upon the number of particles and an etch rate.

According to some embodiments, the diluted cleaning solution is a mixed solution of ammonia, hydrogen peroxide solution, and deionized water (DI water). The concentration of the hydrogen peroxide solution in the diluted cleaning solution may be a significant technical parameter to affect the number of particles removed and an etch rate. As illustrated in the table of FIG. 5 (wherein the dilution rate ratios are listed for ammonia solution: hydrogen peroxide solution: DI water), if the concentration of the hydrogen peroxide solution is reduced, an etch rate of polysilicon is increased significantly. This is because if the concentration of the hydrogen peroxide solution is reduced, a dissolving speed of the hydrogen peroxide solution is increased and thus the polysilicon is not sufficiently oxidized. Due to the lack of the hydrogen peroxide solution, the etch rate of the polysilicon is increased to rapidly increase the number of particles removed. In view of the foregoing, it is preferable that the concentration of the hydrogen peroxide solution in the diluted cleaning solution is at least five (5) volume percent (percent by volume).

Figure 6:
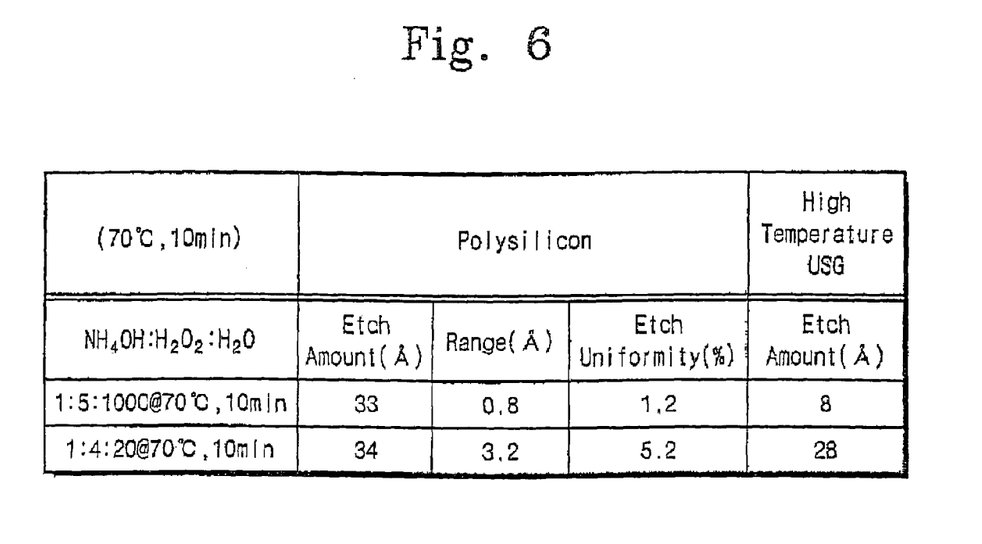
FIG. 6 is a table for explaining an influence of a dilution ratio of a cleaning solution upon etching characteristics of polysilicon and high temperature USG.

The concentration of the DI water determines a dilution ratio of the diluted cleaning solution. In order to determine etching characteristics based on the dilution rate, tests were performed for measuring etching characteristics of a first cleaning solution (ammonia solution: hydrogen peroxide solution: DI water=1:5:1000) and a second cleaning solution (ammonia solution: hydrogen peroxide solution: DI water=1:4:20). The tests were performed at a temperature of 70 degrees centigrade for 10 minutes to measure the etch amounts of polysilicon and high temperature USG. FIG. 6 shows the results measured from tests where polysilicon and high temperature USG were etched using the first and second cleaning solutions.

Referring to FIG. 6, although the first and second cleaning solutions have different dilution rates (as shown in the first column of the table), their etch amounts (as shown in the second column of the table) for polysilicon are nearly identical to each other. That is, an etch amount using the first solution was 33 angstroms and an etch amount using the second solution was 34 angstroms. However, their etch amounts for high temperature USG were different from each other. That is, an etch amount using the first solution was 8 angstroms and an etch amount using the second solution was 28 angstroms for high temperature USG. Therefore, the first cleaning solution having a higher dilution rate can be advantageously used in a process for selectively etching only polysilicon while minimally etching high temperature USG.

According to embodiments of the invention, the concentrations of the ammonia solution, the hydrogen peroxide solution, and the DI water in the diluted cleaning solution are from about 0.1 to 1 volume percent, 0.3 to 1 volume percent, and 98 to 99.6 volume percent, respectively. According to some embodiments, the cleaning process using the diluted cleaning solution is performed at a temperature of about 70 degrees centigrade and may be performed within a temperature range of from about 40 to 80 degrees centigrade.

According to some embodiments, before the cleaning process using the diluted cleaning solution is performed, a predetermined pad insulation layer 18 (FIG. 4B) is formed on an entire surface or side of the resultant structure where the device isolation layer 10 is formed. The pad insulation layer 18 may be formed of silicon oxide having an etch selectivity with respect to the semiconductor substrate 1 such that the etch rate of the diluted cleaning solution for the active regions 20 is greater than the etch rate of the diluted cleaning solution for the pad insulation layer 18. The pad insulation layer 18 may be formed of, for example, medium temperature oxide (MTO).

The cleaning process may be performed using at least one process selected from the group consisting of a spin spray process, a centrifugal spray process, a spin process using DI-Sonic, a dip process, and a dip process using megasonic power.

Because the ratios or concentrations of materials constituting the diluted cleaning solution are significant, they should be maintained in the cleaning solution. Particularly, it may be preferable to regularly maintain a prescribed ratio or concentration of the hydrogen peroxide solution in the diluted cleaning solution. In order to maintain the ratio or concentration, the cleaning process can be performed in a predetermined bath into which the diluted cleaning solution is supplied at a regular flow rate (i.e., an overflow cleaning process can be used).

As explained so far, in accordance with embodiments of the invention, a diluted cleaning solution for selectively etching a semiconductor substrate with respect to a device isolation layer is used to clean a semiconductor substrate wherein a recess channel region has been formed. Thus, a protrusion formed at a boundary portion of the recess channel region contacting the device isolation layer is removed to prevent an electrical short between an active region and a gate conductive layer. In addition, a semiconductor substrate having a recess channel region is cleaned using a diluted cleaning solution. Namely, a wet cleaning method is used to enhance the productivity or efficiency of the cleaning process.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention. Therefore, it is to be understood that the foregoing is illustrative of the present invention and is not to be construed as limited to the specific embodiments disclosed, and that modifications to the disclosed embodiments, as well as other embodiments, are intended to be included within the scope of the invention.

What is claimed is:

1. A method for cleaning a semiconductor substrate, the method comprising:
   forming device isolation layers in a predetermined region of a semiconductor substrate to define active regions;
   etching predetermined areas of the active regions to form a recess channel region such that sidewalls of the device isolation layers are exposed; and
   selectively etching a surface of the recess channel region without substantially etching the device isolation layers using a predetermined cleaning solution to clean the semiconductor substrate where the recess channel region has been formed.

2. The cleaning method as recited in claim 1, wherein selectively etching the surface of the recess channel region includes selectively etching the device isolation layer at an etch rate that is at least 10 times lower than an etch rate of the recess channel region.

3. The cleaning method as recited in claim 1, wherein the cleaning solution is a mixture including from 0.1 to 1 volume percent ammonia solution, from 0.3 to 1 volume percent hydrogen peroxide solution, and from 98 to 99.6 volume percent deionized water.

4. The cleaning method of claim 3 wherein the concentration of the hydrogen peroxide solution in the cleaning solution is about 0.5 percent by volume.

5. The method of claim 1 wherein the cleaning solutions is a mixture including at least 5 percent by volume hydrogen peroxide solution.

6. The cleaning method as recited in claim 1, wherein selectively etching the surface of the recess channel region is performed at a temperature of about 40 to about 80 degrees centigrade.

7. The cleaning method as recited in claim 1, wherein selectively etching the surface of the recess channel region is performed using at least one process selected from the group consisting of: a spin spray process, a centrifugal spray process, a spin process using DI-Sonic, a dip process, and a dip process using megasonic power.

8. The cleaning method as recited in claim 1, wherein the device isolation layer includes at least one material selected from the group consisting of: high density plasma oxide, high temperature USG, low-k dielectric, SOG, and SiGe.

9. The cleaning method as recited in claim 1, wherein selectively etching the surface of the recess channel region is performed in a predetermined bath into which the cleaning solution is supplied at a predetermined flow rate.

10. The cleaning method as recited in claim 1, wherein forming the device isolation layers comprises:
    forming trench mask patterns on the active regions;
    using the trench mask patterns as etch masks, anisotropically etching the semiconductor substrate to define the active regions;
    forming the device isolation layers to fill the trenches;
    planarizing the device isolation layers until the trench mask patterns are exposed; and
    removing the trench mask patterns.

11. The cleaning method as recited in claim 10 further comprising, before forming the device isolation layers:
    forming a thermal oxide layer on an inner wall of the trench; and
    conformally forming a liner layer on an entire surface of the thermal oxide layer.

12. The cleaning method as recited in claim 1, wherein etching predetermined areas of the active regions comprises:
    forming mask patterns on a resultant structure where the device isolation layers are formed to expose top surfaces of the active regions and the device isolation layers;
    isotropically etching the exposed active regions using the mask patterns as etch masks; and
    removing the mask patterns.

13. The cleaning method as recited in claim 1, further comprising, before selectively etching the surface of the recess channel region, forming a pad insulation layer on a resultant structure where the device isolation layers are formed.

14. The cleaning method as recited in claim 13, wherein the pad insulation layer includes a material having an etch selectivity with respect to the semiconductor substrate such that an etch rate of the cleaning solution for the semiconductor substrate is greater than an etch rate of the cleaning solution for the pad insulation layer.

15. The cleaning method as recited in claim 14, wherein the pad insulation layer includes a silicon oxide containing medium temperature oxide.

16. The cleaning method of claim 13, wherein the recess channel region includes opposing sidewalls of the semiconductor substrate such that the surface of the recess channel region is between the opposing sidewalls, and wherein forming the pad insulation layer further comprises:
    after etching the predetermined areas of the active regions to form the recess channel region, selectively forming the pad insulation layer on surfaces of the active regions adjacent the opposing sidewalls of the substrate such that the surface of the recess channel region is exposed.

17. A method of forming a semiconductor device, the method comprising:

forming device isolation layers on a semiconductor substrate to define an active region therebetween;

forming a recess channel region in the active region to expose sidewalls of the device isolation layers; and selectively etching a surface of the recess channel region between the sidewalls of the device isolation layers using a predetermined cleaning solution without substantially etching the device isolation layers.

18. The method of claim 17, wherein the recess channel region includes opposing sidewalls of the semiconductor substrate such that the surface of the recess channel region is between the opposing sidewalls, and further comprising the following prior to selectively etching the surface of the recess channel region:

forming a pad insulation layer on surfaces of the active region adjacent the opposing sidewalls of the substrate such that the surface of the recess channel region is exposed.

19. The method of claim 17, wherein the predetermined cleaning solution comprises about 0.1 to about 1 percent by volume ammonia solution, about 0.3 to about 1 percent by volume hydrogen peroxide solution, and about 98 to about 99.6 percent by volume deionized water.

* * * * *